United States Patent
Chien et al.

(10) Patent No.: US 6,200,880 B1
(45) Date of Patent: *Mar. 13, 2001

(54) METHOD FOR FORMING SHALLOW TRENCH ISOLATION

(75) Inventors: Sun-Chieh Chien, Hsinchu; Chien-Li Kuo, Hsinchu Hsien; Tzung-Han Lee, Taipei; Wei-Wu Liao, Taipei Hsien, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/192,877

(22) Filed: Nov. 16, 1998

(51) Int. Cl.⁷ .................................................. H01L 21/76
(52) U.S. Cl. ......................... 438/424; 438/437; 438/701; 438/713; 438/978
(58) Field of Search ..................... 438/424, 425, 438/426, 435, 437, 700, 701, 713, 978, 227 F; 148/DIG. 50, DIG. 161

(56) References Cited

U.S. PATENT DOCUMENTS

| 4,419,813 | * | 12/1983 | Iwai | 29/576 W |
|---|---|---|---|---|
| 4,491,486 | * | 1/1985 | Iwai | 148/105 |
| 4,571,819 | * | 2/1986 | Rogers et al. | 29/576 W |
| 5,366,925 | * | 11/1994 | Lur et al. | 437/70 |
| 5,482,879 | * | 1/1996 | Hong | 437/43 |
| 5,624,865 | * | 4/1997 | Schuegraf et al. | 438/396 |
| 5,726,090 | * | 3/1998 | Jang et al. | 438/435 |
| 5,780,346 | * | 7/1998 | Arghavani et al. | 438/296 |
| 5,817,567 | * | 10/1998 | Jang et al. | 438/427 |
| 5,834,341 | * | 11/1998 | Chen | 438/152 |
| 5,953,613 | * | 9/1999 | Gardner et al. | 438/301 |

OTHER PUBLICATIONS

Wolf, et al., "Silicon Processing For The VLSI Era", 1986, vol. 1, pp. 168–169.*

* cited by examiner

Primary Examiner—Long Pham
(74) Attorney, Agent, or Firm—Oppenheimer Wolff & Donnelly, LLP

(57) ABSTRACT

A method for forming a shallow trench isolation used to isolate a device is provided. A pad oxide and a mask layer are formed on a substrate and patterned. A trench is formed within the substrate under the patterned region and the trench is filled with insulator to form an insulation plug, which is a shallow trench isolation. A dielectric layer is formed on the whole substrate surface to cover the device region and the insulation plug.

15 Claims, 4 Drawing Sheets

METHOD FOR FORMING SHALLOW TRENCH ISOLATION

BACKGROUND OF THE INVENTION

1. Field of the Invention

This invention relates in general to a method for forming isolation, and more specifically relates to a method for forming shallow trench isolation (STI) which effectively reduces the kink effect.

2. Description of Related Art

There may be hundreds of thousands of devices formed on a single silicon substrate within an area of about 1–2 cm². In order to keep the devices from disturbing each other, the existence of isolation regions formed between the devices is very important for modern semiconductor manufacturing technology. The local oxidation of silicon (LOCOS) is used widely for forming isolation regions in a conventional method. Another method for forming isolation regions is shallow trench isolation (STI,) by which a trench is formed within a substrate and is filled with insulator. The STI method is a necessary technology for process under 0.25 μm.

FIGS. 1A through 1D schematically illustrate a conventional manufacturing process for forming a shallow trench isolation (STI) structure. Referring to FIG. 1A, a pad oxide 11 and a mask layer 12 are sequentially formed on a semiconductor substrate 10 and are patterned by photolithography and etching technologies. A trench 13 inside he substrate 10 is formed by anisotropic etching.

Referring to FIG. 1B, a liner oxide 14 is formed along the sidewalls and the bottom of the trench 13. Afterwards, an insulation layer is deposited on the mask layer 12 and fills the trench 13. With the help of chemical mechanic polishing (CMP), the insulation layer outside the trench 23 is removed and an insulation plug 15 is formed thereafter, as shown in FIG. 1C. A shallow trench isolation structure is then formed as shown in FIG. 1D after the mask layer 12 and the pad oxide 11 are removed.

Because the step for removing the pad oxide 11 uses isotropic etching, an over etching effect easily occurs at the edges of the insulation plug 15 by which a narrow dished portion 19 is formed and exposes a sharp corner 16. The sharp corner 16 easily accumulates electric charges, which will reduce the threshold voltage of devices to produce an abnormal sub-threshold current, called the kink effect. Therefore, the quality and the yield of devices are reduced.

At present time, the method mostly adapted for improving the kink effect is to change the corner shape so as to reduce the sub-threshold current. Rounding the sharp corner is a method for reducing the kink effect, and a rounded corner 17 is shown in FIG. 1E. Another conventional method for reducing the kink effect is to fill the narrow dished portion with insulator. However, the sub-threshold current is still produced even when the corner shape is changed. A large amount of the electric charge is induced by plasma used in the following processes, which the induced charges accumulate around the corner of the trench so that the kink effect occurs again.

SUMMARY OF THE INVENTION

According to the foregoing description, an object of this invention is to provide an improved manufacturing process for forming a shallow trench isolation structure. A dielectric thin film (such as $Si_3N_4$ film) and devices are deposited on the whole device surface after the shallow trench isolation and is formed by which the dielectric thin film can prevent $H^+$ penetration induced by plasma process thereafter do not accumulate charges around the corner, which prevents a kink effect and leakage.

In accordance with the foregoing objective, a manufacturing process for forming a shallow trench isolation structure is provided. A pad oxide and a mask layer are formed sequentially on a substrate. After patterning the mask layer and the pad oxide, a trench is formed within the substrate. An insulation layer is formed and fills the trench to form an insulation plug. The insulation layer, the mask layer and the pad oxide outside the trench are removed to form a shallow trench isolation structure, and a dielectric layer is formed to cover the whole surface. The material of the dielectric layer can isolate the large amount of electric charges induced by plasma in the following process, which can significantly reduce the kink effect.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

FIGS. 2A through 2E illustrate the manufacturing process of a STI structure according to the preferred embodiment of this invention.

Figure 1A:
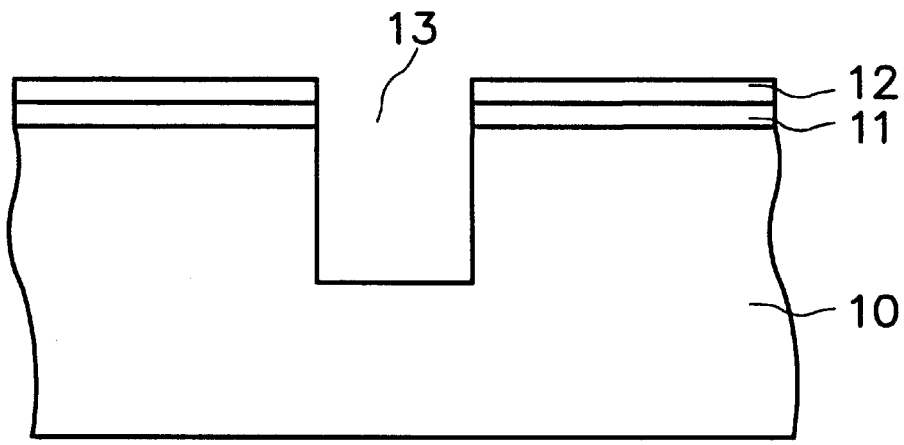
FIGS. 1A through 1D schematically illustrate a conventional manufacturing process or forming a shallow trench isolation structure.
Figure 1B:
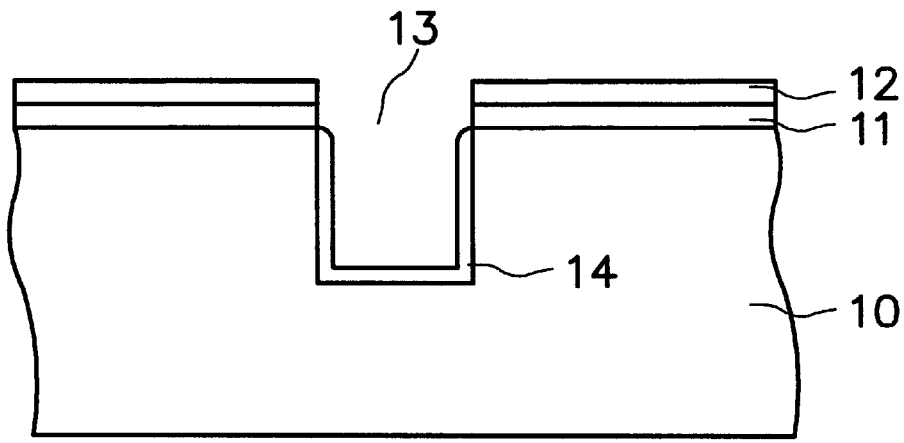
Figure 1C:
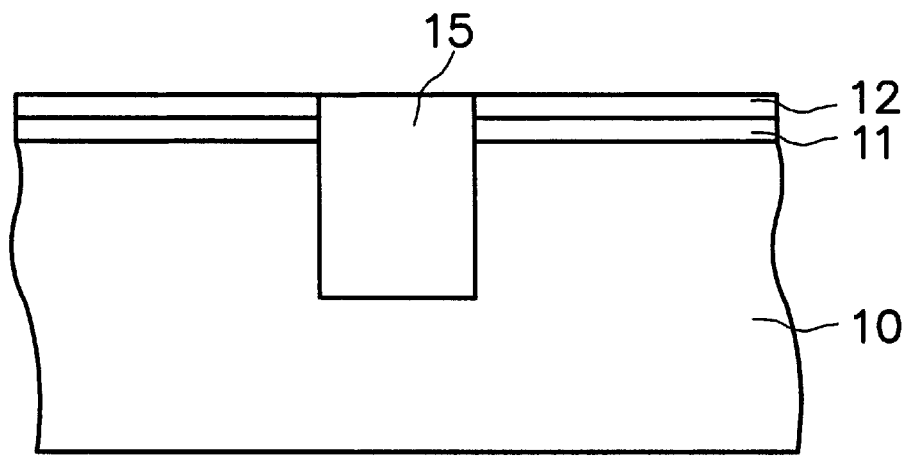
Figure 1D:
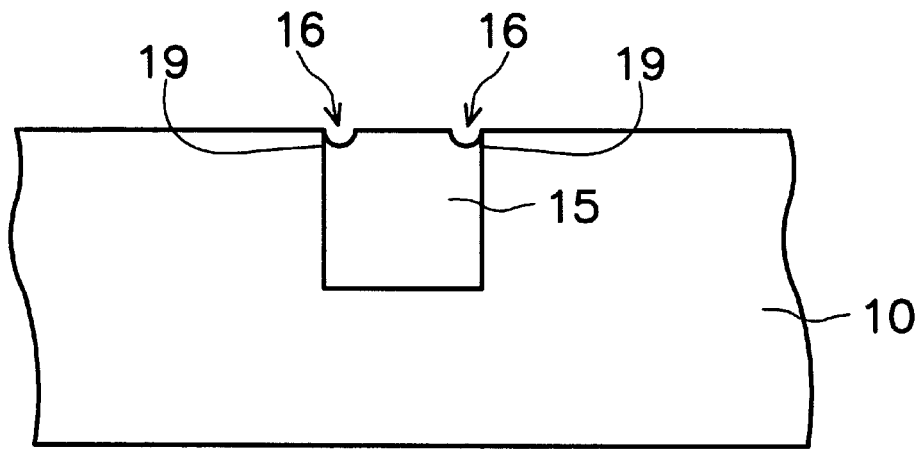
Figure 1E:
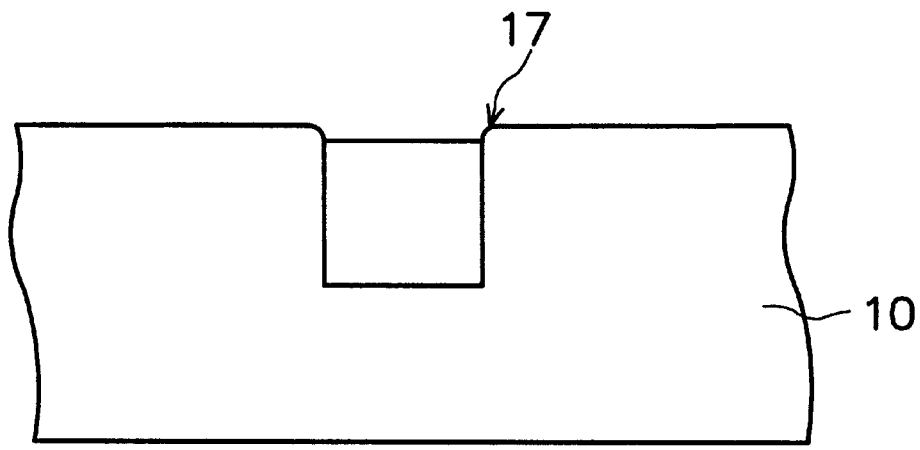
FIGS. 1E and 1F show conventional, improved methods for reducing the kink effect by changing the corner shape of the trench.
Figure 1F:
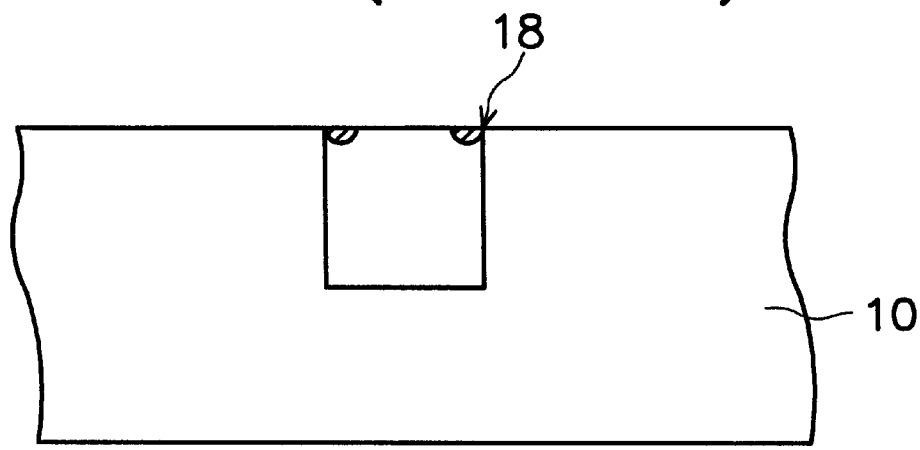
Figure 2A:
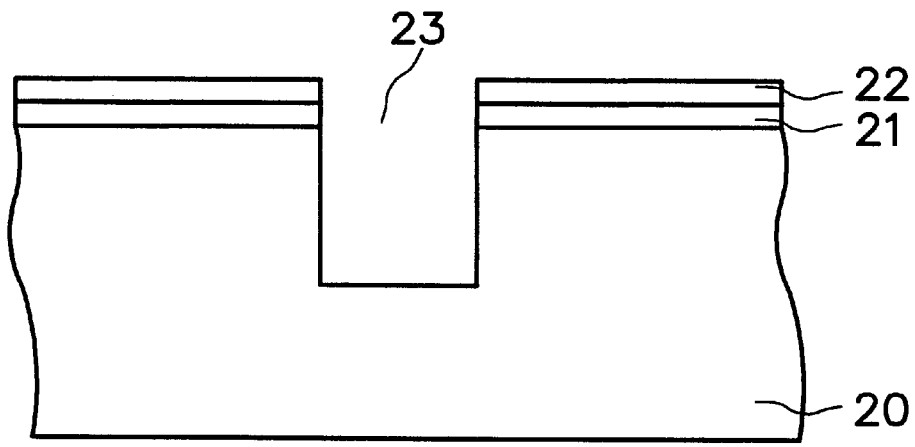
FIGS. 2A through 2E schematically illustrate a manufacturing process for forming a shallow trench isolation structure in accordance with the preferred embodiment of this invention.

Referring to FIG. 2A, a pad oxide 21 is formed on a provided semiconductor substrate 20, and the thickness of the pad oxide 21 is, for example, about 100 Å to about 150 Å. A mask layer 22 whose material can be silicon nitride or other similar is formed, for example, by atmospheric pressure chemical vapor deposition (APCVD). The thickness of the mask layer is, for example, about 1000 Å to about 2000 Å. By photolithography and etching technologies, the mask layer 22 and the pad oxide 21 are patterned to define a trench region. More specifically, the exposed regions of the mask layer 22 and the pad oxide 21 are removed, and the thus exposed substrate 20 is etched, for example, by anisotropic etching to form a trench 23 within the substrate 20.

Figure 2B:
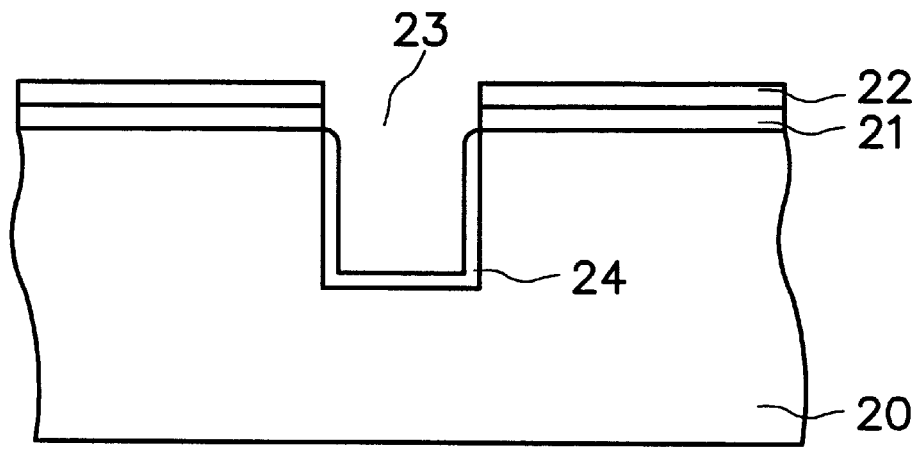
Figure 2C:
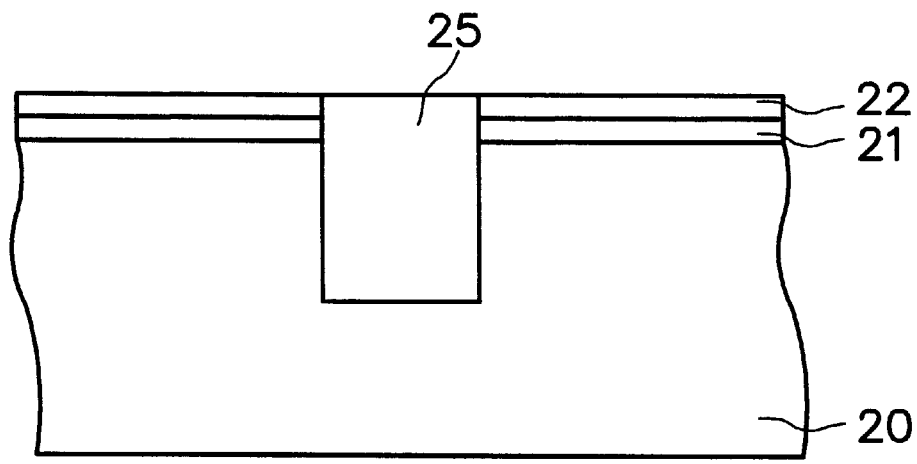

Referring to FIG. 2B, a liner oxide 21 is formed along the sidewalls and on the bottom of the trench 23 by means of thermal oxidation. An insulation layer whose material can be silicon oxide ($SiO_2$) is formed on the silicon nitride layer 22 and fills the trench 23. With the help of chemical mechanic polishing (CMP), the insulation layer outside the trench 23 is removed and an insulation plug 25 is formed thereafter, as shown in FIG. 2C.

The insulation layer mentioned above is formed by means of chemical vapor deposition (CVD) with ozone and tetraethyl-ortho-silicate (TEOS) as the reaction gas. In addition, the silicon nitride layer 22 serves as a stop layer while performing the CMP process mentioned above.

Figure 2D:
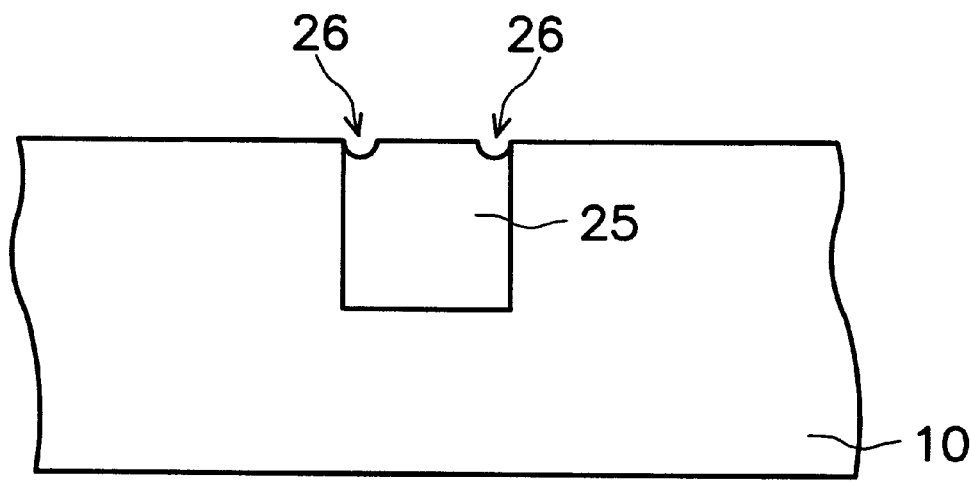

Referring to FIG. 2D, the silicon nitride layer 22 is removed, for example, by hot phosphoric acid and the liner oxide 21 is etched away, for example, by HF solution. The HF solution is a kind of isotropic etchant, and the narrow dished portion 26 easily occurs at the edge of the insulation plug 25 due to over-etching.

Figure 2E:
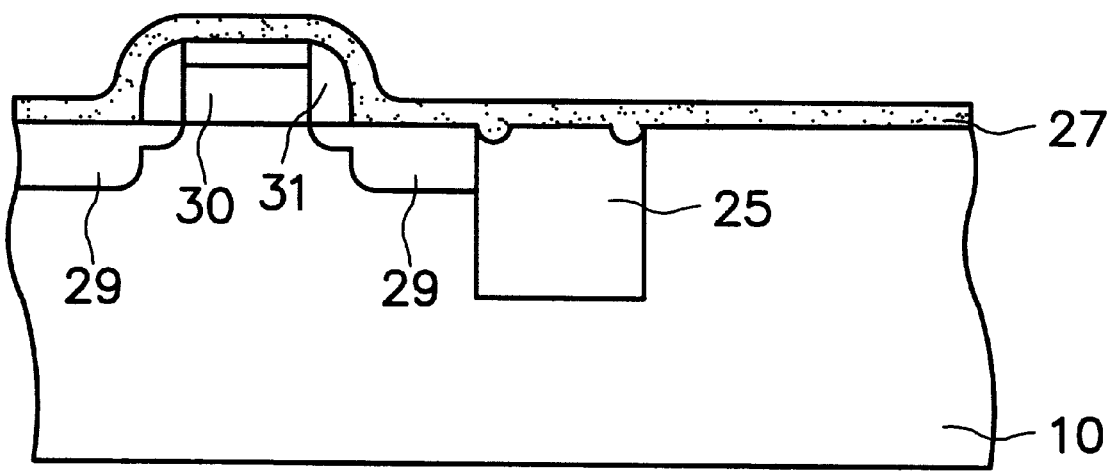

After the insulation plug 25 is formed within the substrate 10, a device, which can be a metal-oxide-semiconductor (MOS) transistor or others, is then formed. The MOS transistor at least has a source/drain region 29, a gate 30 and a spacer 31 as shown in FIG. 2E.

Referring to FIG. 2E again, a dielectric layer 27 is formed on the whole surface of the substrate 10 to cover the device region and the insulation plug 25. Chemical vapor deposition is one of the methods suitable for forming the dielectric layer 27. The material of the dielectric layer is capable of isolating the charges induced by plasma in the following process, and silicon nitride is one of the materials suitable for these purposes.

In the following manufacturing process, many steps may use plasma such as metal deposition, etching, etc. For an example of depositing a metal layer, the common method is to deposit the metal layer by sputtering with plasma. When the plasma bombards the surface, a large amount of charged particles easily accumulate at a sharp corner, such as the sharp corner between the substrate 20 and the shallow trench 25, which causes device leakage. Even if the sharp corner has been rounded by conventional methods, the charge accumulation cannot be prevented.

However, according to the preferred embodiment of this invention, the dielectric layer 27 formed on the whole surface to cover the device region and the shallow trench efficiently capable of isolating the charged particles induced by plasma and preventing the charged particles from accumulating at the sharp corner. The dielectric layer can prevent the kink effect and leakage from occurring so that the yield increases.

A feature of this invention is the deposition of the dielectric layer on the whole substrate surface to cover the device region and the shallow trench, which can prevent the charged particles induced by plasma in the following processes from accumulating at the sharp corner between the substrate and the shallow trench.

Although this invention is disclosed by an example of forming a shallow trench isolation structure, the method can also apply to any semiconductor process, such as a memory device process. Before a plasma process to form such as an inter layer dielectric (ILD) before metal deposition, a dielectric layer, which can be formed between inter poly dielectric (IPD) layers, is formed to prevent charge accumulation.

While the present invention has been described with a preferable embodiment, this description is not intended to limit the invention. Various modifications of the embodiment will be apparent to those skilled in the art. It is therefore contemplated that the appended claims will cover any such modifications or embodiments as fall within the true scope of the invention.

What claimed is:

1. A method for forming a shallow trench isolation structure, which is used to isolate a device, the method comprising:
    providing a substrate;
    forming a pad oxide layer and a mask layer sequentially on the substrate and patterning the pad oxide layer and the mask layer to form a patterned region;
    forming a trench within the substrate under the patterned region;
    forming a liner oxide layer on a part of the substrate within the trench;
    forming an insulation layer over the substrate to fill the trench;
    removing the insulation layer, the mask layer and the pad oxide layer to expose the substrate, whereby an insulation plug is formed in the trench, the insulation plug having overetched dish portions resulting from removal of the insulation layer, the mask layer and the pad oxide layer; and;
    forming a conformal dielectric layer over a top surface of the substrate, wherein the dielectric layer is operable to fill the overetched dish portions and prevent electric charge from accumulating at the dished portions of the insulating plug.

2. The method of claim 1, wherein the insulation layer includes silicon oxide.

3. The method of claim 1, wherein the dielectric layer includes silicon nitride.

4. The method of claim 1, wherein the dielectric layer is formed by chemical vapor deposition (CVD).

5. The method of claim 1, wherein the pad oxide layer includes silicon oxide.

6. The method of claim 5, wherein a thickness of the pad oxide layer is about 100 Å to 150 Å.

7. The method of claim 1, wherein the mask layer includes silicon nitride.

8. The method of claim 7, wherein a thickness of the mask layer is about 1000 Å to about 2000 Å.

9. The method of claim 1, wherein the pad oxide is formed by thermal oxidation.

10. The method of claim 1, wherein the mask layer is formed by atmospheric pressure chemical vapor deposition (APCVD).

11. A method for forming a shallow trench isolation structure, which is used to isolate a device, the method comprising:
    providing a substrate having a pad oxide layer and a mask layer sequentially formed on the substrate, and a trench in the pad oxide layer, the mask layer, and the substrate;
    providing an insulation plug displaced within the trench, the insulation plug having overetched dish portions resulting from a removal of the mask layer and the pad oxide layer; and
    forming a dielectric layer over a top surface of the substrate, thereby covering the insulation plug and device on the substrate, wherein the dielectric layer is operable to fill the overetched dish portions and prevent electric charge from accumulating at the dished portion of the insulating plug.

12. The method of claim 11, wherein the insulation plug includes silicon oxide.

13. The method of claim 11, wherein the dielectric layer includes silicon nitride.

14. The method of claim 11, wherein the dielectric layer is formed by chemical vapor deposition (CVD).

15. A method for preventing charge accumulation, the method comprising:
    providing a substrate having an overetched dished portion on a top surface of the substrate;
    forming a conformal silicon nitride layer on the top surface of the substrate, the silicon nitride layer operable to fill the dished portion, thereby preventing charge from accumulating on the dished portion due to a subsequent plasma process; and
    performing the plasma process.

* * * * *